United States Patent [19]
Anderson et al.

[11] Patent Number: 5,365,108
[45] Date of Patent: Nov. 15, 1994

[54] METAL MATRIX COMPOSITE SEMICONDUCTOR POWER SWITCH ASSEMBLY

[75] Inventors: W. Kyle Anderson; Richard J. Hoppe; William J. Durako, Jr., all of Rockford; Mark Metzler, Davis; Lawrence Hughes; Stephen E. Jackson, both of Rockford, all of Ill.

[73] Assignee: Sundstrand Corporation, Rockford, Ill.

[21] Appl. No.: 979,088

[22] Filed: Nov. 19, 1992

[51] Int. Cl.⁵ ..................... H01L 23/02; H01L 23/12
[52] U.S. Cl. ..................... 257/678; 257/691; 257/692; 257/703; 257/708; 361/772; 361/775; 174/52.4
[58] Field of Search ............... 257/678, 691, 692, 699, 257/708, 709, 703; 174/52.4; 361/772, 775

[56] References Cited

U.S. PATENT DOCUMENTS

| | | | |
|---|---|---|---|
| 3,381,372 | 5/1968 | Capano | 257/699 |
| 3,419,763 | 12/1968 | Beaudovin | 257/691 |
| 3,784,726 | 1/1974 | Smith et al. | 257/699 |
| 4,167,647 | 9/1979 | Salera | 257/709 |
| 4,314,270 | 2/1982 | Iwatani | 257/708 |
| 4,393,392 | 7/1983 | Hale | 257/691 |
| 4,506,108 | 3/1985 | Kersch et al. | 257/699 |
| 4,646,129 | 2/1987 | Yerman et al. | 357/74 |
| 4,663,649 | 5/1987 | Suzuki et al. | 357/67 |
| 4,806,704 | 2/1989 | Belke, Jr. et al. | 174/524 |
| 5,001,299 | 3/1991 | Hingorany | 257/709 |
| 5,023,703 | 6/1991 | Hidaka et al. | 257/692 |
| 5,038,197 | 8/1991 | Satriano | 257/691 |
| 5,105,260 | 4/1992 | Butera | 257/691 |

*Primary Examiner*—Rolf Hille
*Assistant Examiner*—David Ostrowski
*Attorney, Agent, or Firm*—Whitham & Marhoefer

[57] ABSTRACT

A power semiconductor assembly, particularly a semiconductor switch assembly which has a number of discrete emitter connection pads, comprised of a metal matrix composite housing and a copper or aluminum post with a cross-sectional area sufficiently large to carry the rated current providing a single-point, external connection to all emitter pads. The post passes through and is supported by an insulating ceramic insert such as aluminum oxide in the wall of the metal matrix composite housing. The post is hollowed out in the region where it passes through the ceramic insert in order to reduce the mechanical stress between the post and the insulating insert as a result of the mismatch in their thermal expansion coefficients. Buses on either side of the semiconductor die provide surfaces for connection from the post to the discrete emitter connection pads on the die.

6 Claims, 4 Drawing Sheets

METAL MATRIX COMPOSITE SEMICONDUCTOR POWER SWITCH ASSEMBLY

BACKGROUND OF THE INVENTION

1. Field of the Invention

The present invention generally relates to a semiconductor assembly which has a metal matrix composite housing, and more particularly to a power switch assembly.

2. Description of the Prior Art

Metal matrix composites are known in the art and comprise, for example, aluminum and silicon carbide. These metal matrix composites are relatively light in weight, are good conductors of heat, and can be formulated to have a desired coefficient of expansion. Proposals have been made in the prior art for semiconductor housing employing metal matrix composites, for example, U.S. Pat. No. 4,806,704 to Belke et al.

SUMMARY OF THE INVENTION

One object of this invention is the provision of an improved metal matrix composite power semiconductor assembly; an assembly which is easy to manufacture and provides good dissipation of thermal energy generated by the power semiconductor.

Another object of the invention is the provision of a semiconductor power switch assembly with a single external point of attachment for the power output lead.

Briefly, this invention contemplates provision of a power semiconductor assembly, particularly a semiconductor switch assembly which has a number of discrete emitter connection pads, comprised of a metal matrix composite housing and a copper or aluminum post with a cross-sectional area sufficiently large to carry the rated current providing a single-point, external connection to all emitter pads. The post passes through and is supported by an electrically insulting insert, such as aluminum oxide in the wall of the metal matrix composite housing. The post is hollowed out in the region where it passes through the electrically insulating insert in order to reduce the mechanical stress between the post and the insulating insert as a result of the mismatch in their thermal expansion coefficients. Buses on either side of the semiconductor die provide surfaces for connection from the post to the discrete emitter connection pads on the die.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
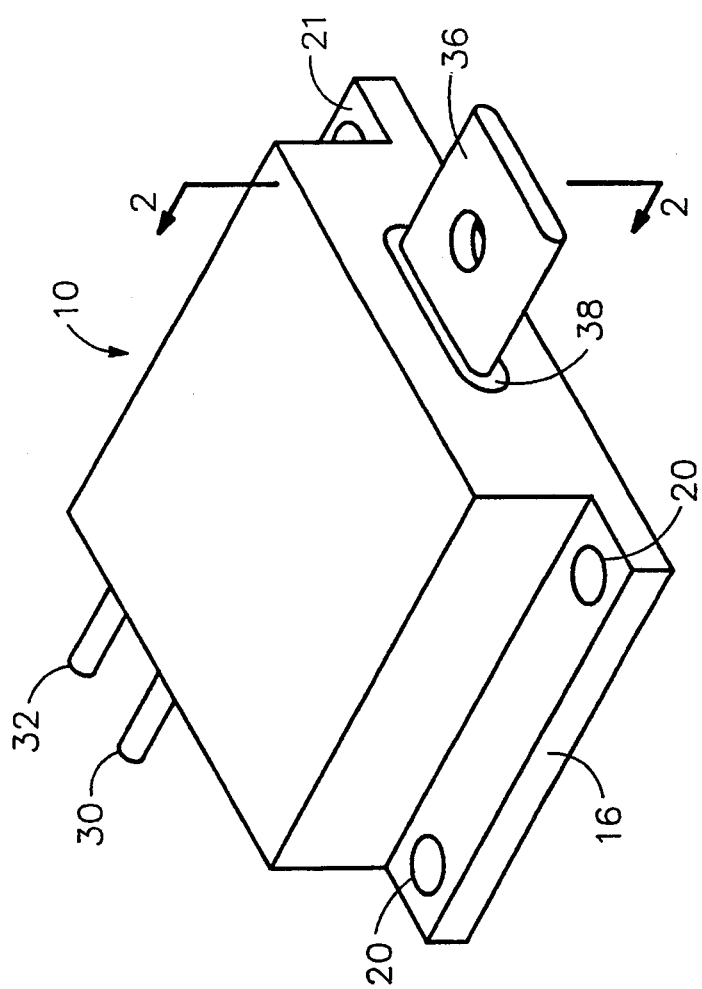
FIG. 1 is an overall perspective view of a power semiconductor switch assembly along the line 2—2 of in accordance with the invention.
Figure 2:
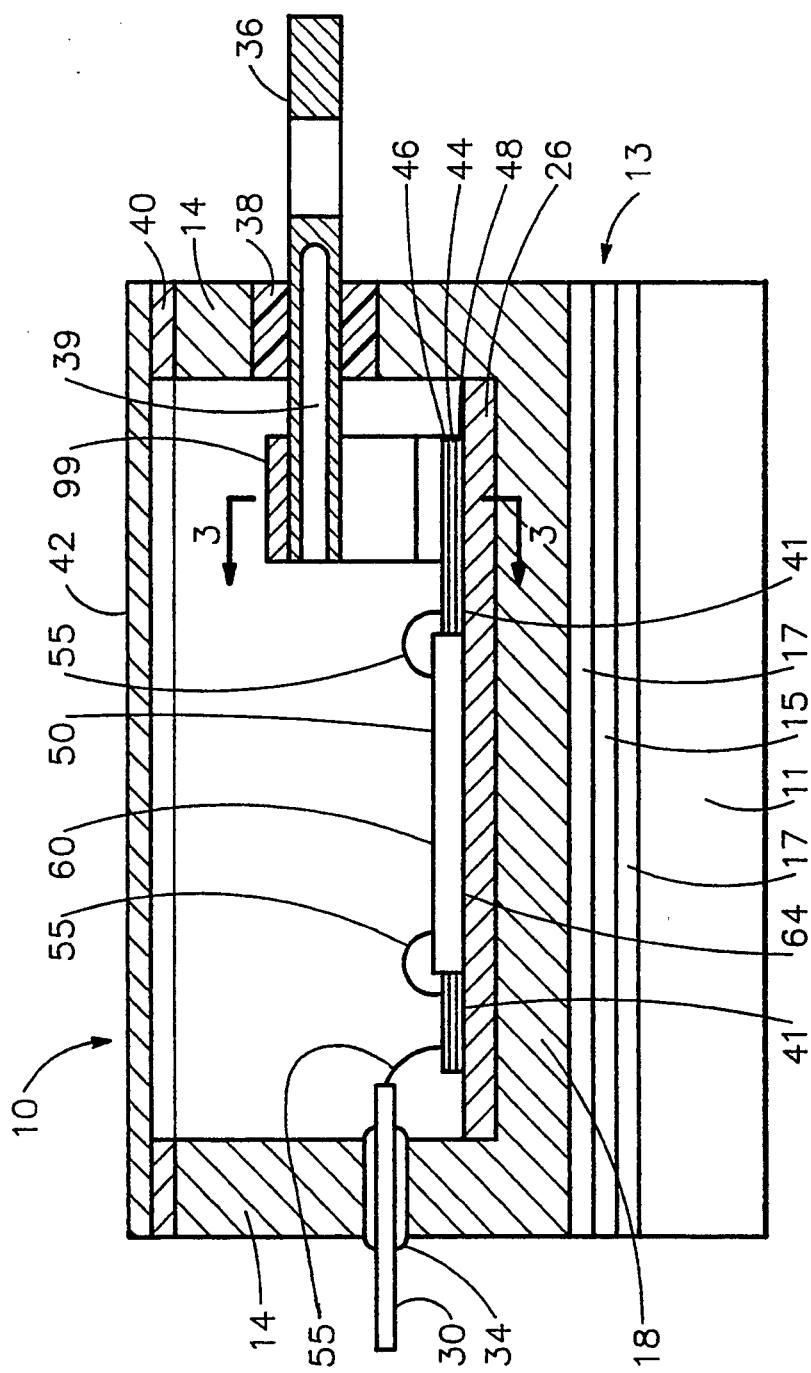
FIG. 2 is a sectional view of the assembly FIG. 1.
Figure 3:
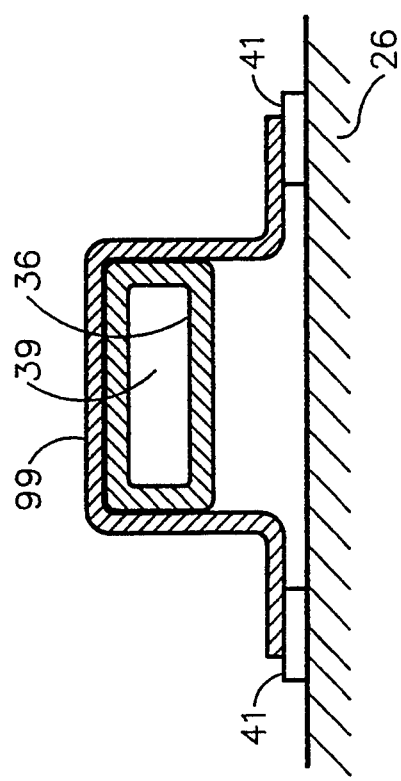
FIG. 3 is a fragmentary sectional view along the line 3—3 of FIG. 2.

Referring now to FIGS. 1, 2 and 3 of the drawings, a housing, indicated by the general reference numeral 10, provides a heat dissipating, electrically non-isolated support for a semiconductor power transistor, such as an insulated gate bipolar transistor switch. In a typical transistor switch (e.g., an insulated bipolar transistor switch) assembly to which this invention is particularly directed, a lower surface 64 of a semiconductor die 50 provides a surface for attachment of the collector lead. An upper surface 60 of the die 50 has a number of discrete pads. These pads consist of emitter, and gate or signal pads. Leads from outside the housing must be connected to these pads. In a non-isolated (i.e., housing at collector potential) embodiment of the invention as shown here, an insulating layer 13 is provided between the outer surface of the housing 10 and a heat-exchanging base 11. Alternatively, if desired, isolation could be provided within the housing itself. In this case, two power terminals could pass through the housing wall, one for the emitter and one for the collector. The insulating layer 13 may comprise a commercially available laminate of a thin layered insulating material such as beryllia 15 with conducting metal surface, such as nickel 17 on either side. It should be noted that the nickel layers are relieved slightly to provide a setback to reduce the tendency to arc.

As shown in FIG. 2 the semiconductor switch die 50 is supported on a one-piece, molded metal matrix ceramic base 18, which has four upstanding side walls 14, and flanges 16 and 21. The metal matrix ceramic (MMC) subassembly is a composite of a ceramic powder, such as silicon carbide or aluminum nitride reinforced with aluminum that is infused into the ceramic powder. The aluminum can be either pure aluminum or an aluminum alloy. The resulting MMC has a coefficient of thermal expansion (CTE) similar to the coefficient of the semiconductor die material, on the order of 8.5 PPM/° C., a thermal conductivity similar to aluminum and an electrical conductivity that is approximately 10% of that of copper.

Referring now particularly to FIG. 1, bolts (not shown) passing through openings 20 in the flanges 16 and 21 secure the housing to the heat-exchanging base 11 (FIG. 2). The housing itself serves to couple an external collector lead to the semiconductor power switch die in the housing. One or more of the bolts can be used to secure a collector power lead to the housing.

In the embodiment shown in FIG. 2, a metal matrix composite layer 26 is formed on the base 18 to provide a mounting surface for semiconductor die 50. Layer 26 can be formed with a lower coefficient of thermal expansion than the molded base; layer 26 can be formed with a lower coefficient of thermal expansion than the molded base by increasing the ceramic to aluminum ratio. For example, a coefficient of thermal expansion in the range 6.0 PPM/° C., comparable to that of molybdenum and the die 50, a thermal conductivity comparable to aluminum and a electrical conductivity comparable to 10% of copper. Mounting surface layer 26 can be formed separately and soldered or brazed to the base or formed as part of the step of infiltrating aluminum into the molded metal matrix ceramic subassembly.

A gate lead 32 (FIG. 1) and a similar Kelvin emitter signal lead 30 pass through one side wall 14 of the housing and may be insulated from the wall with ceramic feed-through insulators 34 (FIG. 2). Conventional glass feed-throughs could also be used.

A single copper or aluminum post 36 of relatively large cross-sectional area supported in wall 14 by a ceramic alumina insulator 38 provides a single point power connection for the emitter potential. The cross-section of post 36 is large enough to carry the combined current from all emitter pads, i.e., full rated switch current. Preferably, the post 36 is hollowed out in a region 39 where it passes through the ceramic insulator. Hollowed out region 39 forms a deformable, somewhat resilient conductive shell that prevents excessive stress in the alumina insulator because of the coefficient of expansion mismatch between the post and the insulator. It will be appreciated that the cross-sectional area of the post in the hollowed out region is still sufficiently large that it can carry the anticipated power current.

An aluminum flange 40 (FIG. 2) is bonded around the top of the side walls 14 and an aluminum or metal matrix cover 42 is secured to the flange by laser welding, seam welding, or soldering. All aluminum components, such as the flange 40 and the alumina insulators 38 and 34 can be bonded to the MMC at the same time and sealed during the aluminum infiltration process. The cover attachment could be made by providing a metalized or plated surface on the top of the side walls 14. The cover could then be soldered or brazed to the housing. If a metal matrix cover is used it could be treated in a similar manner.

Figure 4:
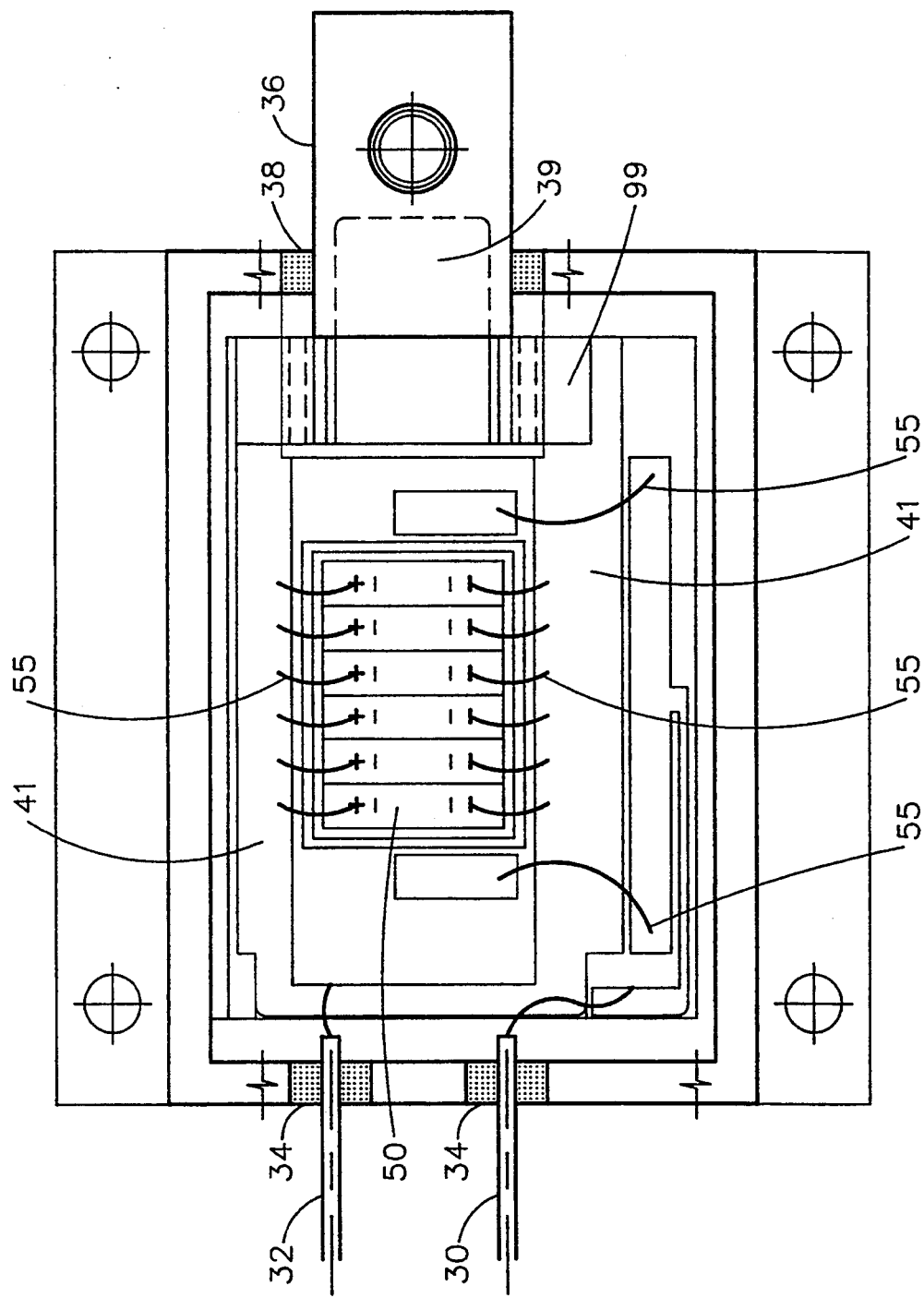
FIG. 4 is a plan view of the assembly shown in FIG. 2 with the top cover removed.

Referring now to FIG. 4 in addition to the figures previously referred to, the semiconductor die 50 is soldered to the layer 26; as mentioned above, the housing provides one power connection to the collector through the lower surface of the die. Buses 41 comprised of a ceramic core such as aluminum oxide 44 with direct bonded copper layers 46 and 48 on either side thereof are also soldered or brazed to the base 26 and serve to couple the external gate, Kelvin and emitter leads to the respective individual points of attachment pads on the die. Conventional bonding wires 55 couple the low power external leads 30 and 32 to the bus strips and from the bus strips to pads on the die. A copper strip 99 is soldered, razed, or welded to the high power emitter post 36 and to bus 41.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A semiconductor assembly comprising:
   a metal matrix composite housing having a base and a plurality of side walls, one of said side walls having an opening disposed therethrough;
   a semiconductor die having a plurality of power electrode pads on an upper surface of said semiconductor die and a power electrode on a lower surface of said semiconductor die;
   said lower surface of said semiconductor die mechanically and electrically connected to said base;
   a partially hollow conductive post sufficiently large in cross-section to conduct current to said plurality of electrode pads on said upper surface of said semiconductor die;
   an insulating insert disposed within said opening disposed through said one of said side walls, said post extending through said insulating insert and insulated from said one of said side walls by said insulating insert;
   a conductive bus mechanically secured to said base;
   a lead coupling said post to said bus; and
   a plurality of leads coupling said bus to said power electrode pads on said upper surface of said semiconductor die.

2. A semiconductor assembly as in claim 1 wherein said partially hollow post is resiliently deformable in a region where said partially hollow post extends through said insulating insert disposed within said side wall.

3. A semiconductor assembly as in claim 2, wherein said insert is a ceramic insulating material such as alumina.

4. A semiconductor assembly as in claim 1, further including a thin metal matrix composite layer disposed between said base of said housing and said lower surface of said semiconductor die power electrode, said thin layer having a coefficient of thermal expansion that is lower than that of said base.

5. A semiconductor assembly as in claim 3, wherein said post is an aluminum post.

6. A semiconductor assembly as in claim 3, wherein said post is a copper post.

* * * * *